United States Patent
Kim

(10) Patent No.: US 7,229,925 B2
(45) Date of Patent: Jun. 12, 2007

(54) METHODS OF FORMING A PATTERN FOR A SEMICONDUCTOR DEVICE

(75) Inventor: In Su Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/021,072

(22) Filed: Dec. 22, 2004

(65) Prior Publication Data

US 2005/0136630 A1 Jun. 23, 2005

(30) Foreign Application Priority Data

Dec. 23, 2003 (KR) ............ 10-2003-0095855

(51) Int. Cl.
*H01L 21/3213* (2006.01)
(52) U.S. Cl. .................. 438/689; 438/690; 216/37; 216/39
(58) Field of Classification Search ............... 216/37, 216/39; 438/689, 690
See application file for complete search history.

(56) References Cited

U.S. PATENT DOCUMENTS 6,483,146 B2 * 11/2002 Lee et al. ............... 257/317
6,562,696 B1 * 5/2003 Hsu et al. ............... 438/424
2004/0082177 A1 * 4/2004 Lee ......................... 438/690

FOREIGN PATENT DOCUMENTS

KR 10-2000-0039797 A 7/2000
KR 10-2002-0013708 A 2/2002

OTHER PUBLICATIONS

S. Rossnagel, Handbook of Plasma Processing Technology, Noyes Pulblications, (1990), pp. 207, 198,221 and 227.*
S. Wolf, Silicon processing for the VLSI Era, vol. 1, Lattice press (1986) pp. 418-419.*

* cited by examiner

*Primary Examiner*—Lan Vinh
*Assistant Examiner*—Maki Angadi
(74) *Attorney, Agent, or Firm*—Andrew D. Fortney

(57) ABSTRACT

Methods of forming a pattern for a semiconductor device are disclosed, wherein a critical dimension (CD) of a pattern can be accurately controlled and, thus, finer critical dimension can be realized. An illustrated example method comprises: forming an etching target layer on a semiconductor substrate; forming a photoresist pattern on the etching target layer; forming polymer spacers on side surfaces of the photoresist pattern to improve side-surface roughness of the photoresist pattern; and etching the etching target layer using the photoresist pattern and the polymer spacers as a mask to form a pattern.

17 Claims, 2 Drawing Sheets

METHODS OF FORMING A PATTERN FOR A SEMICONDUCTOR DEVICE

FIELD OF THE DISCLOSURE

The present disclosure relates generally to semiconductor fabrication, and more particularly, to methods of forming a pattern for a semiconductor device.

BACKGROUND

As the size of semiconductor devices decreases, the formation of patterns becomes more and more important. Above all, it is very important to control the critical dimensions (CD) defining gaps between lines and between spaces.

In manufacturing semiconductor devices, patterns are generally formed through a photolithography process requiring masks. That is, portions not masked with photoresist patterns are selectively etched, thereby forming patterns having desired sizes and shapes. Accordingly, the critical dimensions CD are controlled using only the photoresist patterns.

As the size of the semiconductor devices decreases, such a conventional pattern forming method more and more approaches a limit. In particular, the photolithography process has required increased exposure resolution to form finer patterns. However, it is very difficult to form such finer patterns.

DETAILED DESCRIPTION

Figure 1A:
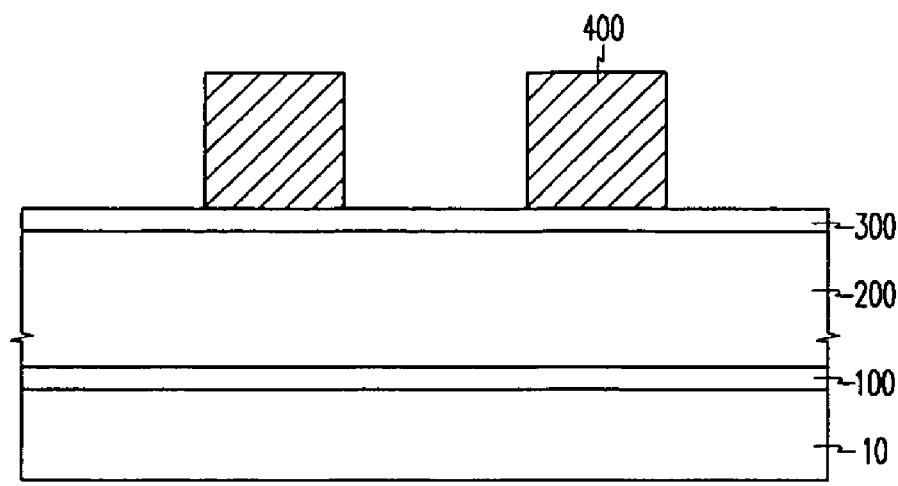
FIGS. 1A to 1D are cross-sectional views schematically illustrating an example method of forming a pattern for a semiconductor device performed in accordance with the teachings of the present invention.

FIGS. 1A to 1D are cross-sectional views schematically illustrating an example method of forming a pattern for a semiconductor device performed in accordance with the teachings of the present invention. Referring to FIG. 1A, an insulating layer 100, (e.g., an oxide layer), is formed on a semiconductor substrate 10. Next, a polysilicon layer 200 is formed on the insulating layer 100 as an etching target layer. Such a polysilicon layer 200 must be patterned to be used as a gate line, etc. of a semiconductor device.

A bottom anti reflective coating (BARC) layer 300 is formed on the polysilicon layer 200 for the patterning. Thereafter, a photoresist layer is formed on the BARC layer 300. The photoresist layer is exposed and developed through a photolithography process to form a photoresist pattern 400 as an etching mask.

Figure 1B:
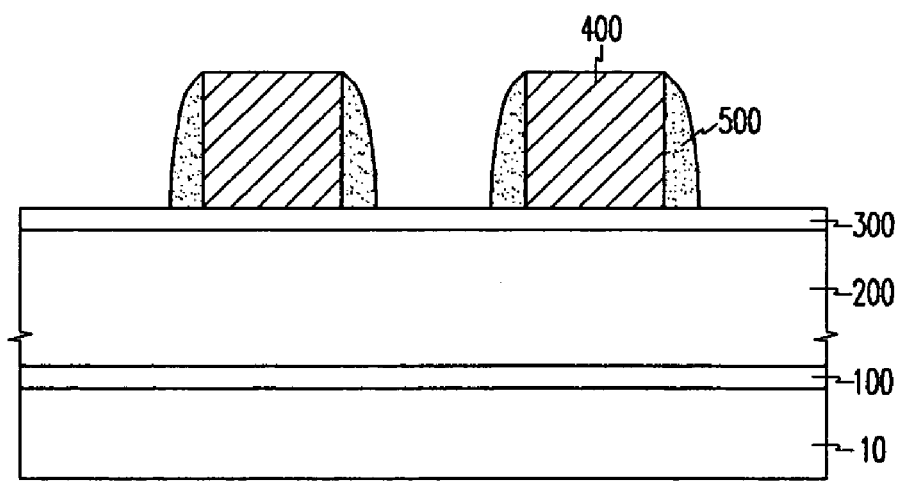

Referring to FIG. 1B, polymer spacers 500 are formed on the side surfaces of the photoresist pattern 400 by deposition. By forming such polymer spacers 500, the roughness of the side surfaces of the photoresist pattern 400 can be improved, and control of the critical dimension can become easier. Specifically, adjusting the thickness of the polymer spacers 500 adjusts the critical dimension. Accordingly, it is possible to realize an accurate pattern profile. Therefore, it is possible to perform very accurate control of the critical dimension of the pattern to be formed.

The deposition of the polymer spacers 500 is performed by putting the entire structure of FIG. 1A (i.e., the structure including the photoresist pattern 400) into a process chamber, (e.g., a process chamber of a dry etching equipment). The process chamber is maintained at a pressure of about 3 to 10 mTorr. The process chamber is supplied with hydrogen bromide gas HBr and oxygen gas as the polymer source gas while a bias power of 50 to 100 W and a source power of 400 to 800 W are applied. The hydrogen bromide gas HBr may be supplied at a flow rate of about 50 to 100 sccm (standard cubic centimeters per minute), and the oxygen gas may be supplied at a flow rate of about 5 to 20 sccm.

The $HBr/O_2$ gas is changed to plasma and drawn to the photoresist pattern 400, etc. due to the bias power. The plasma reacts to organic materials such as the photoresist pattern 400 to generate polymers. The generated polymers are attached to the side surfaces of the photoresist pattern 400, thereby improving the roughness of the side surfaces of the photoresist pattern 400, and allowing the patterning process to achieve a more accurate critical dimension.

Figure 1C:
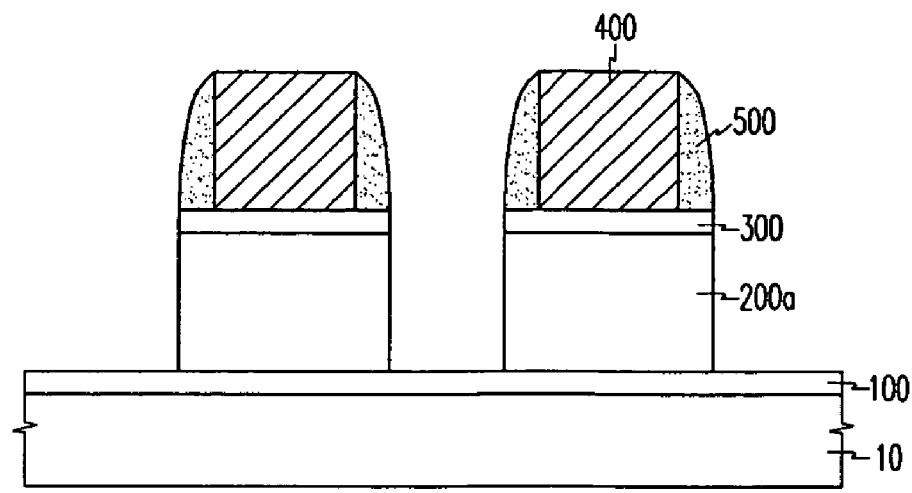

Referring to FIG. 1C, the areas of the BARC layer 300 and the etching target layer (i.e., the polysilicon layer 200) which are exposed through the photoresist pattern 400 and the spacers 500, are sequentially etched. Accordingly, portions other than the portions covered with the photoresist pattern 400 and the spacers 500 are selectively removed, thereby forming a polysilicon pattern 200a.

Since the polysilicon pattern 200a is formed in a state where the side-surface roughness of the photoresist pattern 400 used as an etching mask has been improved, the polysilicon pattern 200a has a very vertical profile. Accordingly, the polysilicon pattern 200a can be accurately controlled to a fine critical dimension CD. Such a vertical profile improves a device characteristic.

The side-surface roughness of the photoresist pattern 400 results from a limit of the photolithography process and has a bad influence on the critical dimension CD control of the patterns, thereby increasing the critical dimension CD. Therefore, by improving the side-surface roughness of the photoresist pattern through the deposition of the polymer spacers 500, it is possible to more accurately control the critical dimension of a pattern. This means that patterning with a finer critical dimension can be allowed.

Figure 1D:
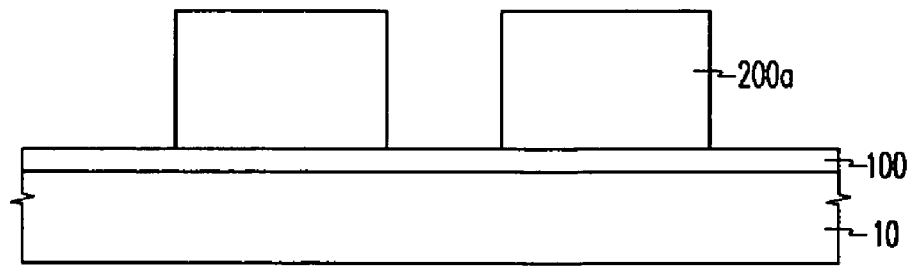

Referring to FIG. 1D, the photoresist pattern 400 and the polymer spacer 500 are removed through ashing and stripping.

From the foregoing, persons of ordinary skill in the art will readily appreciate that, it is possible to improve the side-surface roughness of the photoresist pattern 400 by forming polymer spacers 500 on the side surfaces of the photoresist pattern 400. As a result, the critical dimension CD of the polysilicon pattern 400 can be accurately controlled. Therefore, even when using conventional photolithography equipment, it is possible to realize a pattern having a finer critical dimension.

From the foregoing, persons of ordinary skill in the art will further appreciate that methods of forming a pattern for a semiconductor device have been disclosed, wherein a critical dimension (CD) of the pattern can be accurately controlled and, thus, finer critical dimension can be realized.

A disclosed example method of forming a pattern for a semiconductor device comprises: forming an etching target layer on a semiconductor substrate; forming a photoresist pattern on the etching target layer; forming polymer spacers on side surfaces of the photoresist pattern to improve side-surface roughness of the photoresist pattern; and etching the etching target layer using the photoresist pattern and the polymer spacers as a mask to form a pattern.

It is noted that this patent claims priority from Korean Patent Application Serial Number 10-2003-0095855, which was filed on Dec. 23, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of forming a pattern for a semiconductor device comprising:
    forming a planar etching target layer on a semiconductor substrate;
    forming a bottom anti reflective coating (BARC) layer on the planar etching target layer;
    forming a photoresist pattern on the BARC layer;
    forming polymer spacers on side surfaces of the photoresist pattern and over a top surface of the BARC layer to improve side-surface roughness of the photoresist pattern; and
    etching through an entire thickness of the BARC layer and the planar etching target layer using the photoresist pattern and the polymer spacers as a mask to form a semiconductor device pattern with substantially vertical sidewalls.

2. A method as defined in claim 1, wherein forming the polymer spacers comprises depositing polymers on the side surfaces of the photoresist pattern.

3. A method as defined in claim 2, wherein depositing comprises exposing the photoresist pattern to a plasma comprising hydrogen bromide gas HBr at a flow rate of about 50 to 100 seem and oxygen gas at a flaw rate of about 5 to 20 seem in a process chamber.

4. A method as defined in claim 2, wherein a critical dimension of the pattern is controlled by a thickness of the polymer spacers.

5. A method as defined in claim 3, wherein the process chamber has a pressure of about 3 to 10 mTorr.

6. A method as defined in claim 5, wherein the process chamber has a source power of about 400 to 800 W and a bias power of about 50 to 100 W.

7. A method as defined in claim 6, wherein the photoresist pattern comprises an organic material.

8. A method as defined in claim 7, wherein the plasma reacts with the organic material of the photoresist pattern to form the polymer spacers.

9. A method as defined in claim 1, comprising etching the BARC layer before etching the planar etching target layer.

10. A method as defined in claim 1, further comprising forming an insulating layer on the substrate prior to forming the planar etching target layer.

11. A method as defined in claim 10, wherein the insulating layer comprises an oxide layer.

12. A method as defined in claim 1, wherein the planar etching target layer comprises a polysilicon layer.

13. A method as defined in claim 1, wherein forming the photoresist pattern comprises patterning the photoresist layer by photolithography.

14. A method as defined in claim 1, further comprising removing the photoresist pattern and the polymer spacers by ashing and stripping.

15. A method as defined in claim 10, wherein etching the planar etching target layer exposes a surface of the insulating layer.

16. A method as defined in claim 1, wherein the photoresist pattern comprises an organic material.

17. A method as defined in claim 3, wherein the process chamber is a process chamber of a dry etching equipment.

* * * * *